(12) United States Patent
Chirko et al.

(10) Patent No.: US 11,264,202 B2
(45) Date of Patent: Mar. 1, 2022

(54) GENERATING THREE DIMENSIONAL INFORMATION REGARDING STRUCTURAL ELEMENTS OF A SPECIMEN

(71) Applicant: Applied Materials Israel Ltd., Rehovot (IL)

(72) Inventors: Konstantin Chirko, Rehovot (IL); Itamar Shani, Rehovot (IL); Albert Karabekov, Ashdod (IL); Guy Eytan, Kidron (IL); Lior Yaron, Nes Ziona (IL); Alon Litman, Nes-Ziona (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 16/876,637

(22) Filed: May 18, 2020

(65) Prior Publication Data

US 2021/0358712 A1    Nov. 18, 2021

(51) Int. Cl.
*H01J 37/244* (2006.01)
*H01J 37/22* (2006.01)
(Continued)

(52) U.S. Cl.
CPC ............ *H01J 37/244* (2013.01); *H01J 37/05* (2013.01); *H01J 37/20* (2013.01); *H01J 37/222* (2013.01);
(Continued)

(58) Field of Classification Search
CPC .. H01J 37/00; H01J 37/02; H01J 37/05; H01J 37/20; H01J 37/22; H01J 37/222; H01J 37/244; H01J 37/26; H01J 37/261
(Continued)

(56) References Cited

U.S. PATENT DOCUMENTS 4,308,457 A * 12/1981 Reimer ..................... G01T 1/28
                                                   250/397
6,670,612 B1    12/2003 Lorusso et al.
(Continued)

FOREIGN PATENT DOCUMENTS

| EP | 3343210 A1 | 7/2018 |
| WO | 2014192361 A1 | 12/2014 |
| WO | 2016/052776 | 4/2016 |

OTHER PUBLICATIONS

A.W. Robards, "Ultrastructural Methods for Looking at Frozen Cells", Science Progress (1933-), vol. 61, No. 241, 1974, 1-41.
(Continued)

*Primary Examiner* — Jason L McCormack
(74) *Attorney, Agent, or Firm* — Kilpatrick Townsend & Stockton LLP (57) ABSTRACT

A method, a non-transitory computer readable medium and a three-dimensional evaluation system for providing three dimensional information regarding structural elements of a specimen. The method can include illuminating the structural elements with electron beams of different incidence angles, where the electron beams pass through the structural elements and the structural elements are of nanometric dimensions; detecting forward scattered electrons that are scattered from the structural elements to provide detected forward scattered electrons; and generating the three dimensional information regarding structural elements based at least on the detected forward scattered electrons.

20 Claims, 8 Drawing Sheets

(51) Int. Cl.
*H01J 37/05* (2006.01)
*H01J 37/20* (2006.01)
(52) U.S. Cl.
CPC ............... *H01J 2237/057* (2013.01); *H01J 2237/20207* (2013.01); *H01J 2237/20214* (2013.01); *H01J 2237/221* (2013.01); *H01J 2237/24475* (2013.01)
(58) Field of Classification Search
USPC .................................. 250/306, 307, 311
See application file for complete search history.

(56) References Cited

U.S. PATENT DOCUMENTS

| | | | |
|---|---|---|---|
| 2006/0289752 A1* | 12/2006 | Fukunishi | H01J 37/28 250/310 |
| 2013/0015351 A1* | 1/2013 | Kooijman | G01N 23/203 250/307 |
| 2013/0277553 A1 | 10/2013 | Otani et al. | |
| 2014/0138542 A1* | 5/2014 | Inada | G01N 23/2206 250/310 |
| 2015/0340201 A1* | 11/2015 | Wu | H01J 37/04 250/307 |
| 2020/0027690 A1 | 1/2020 | Wacaser et al. | |
| 2020/0098545 A1* | 3/2020 | Chang | G03F 7/2061 |
| 2021/0005417 A1* | 1/2021 | Shirasaki | H01J 37/1475 |

OTHER PUBLICATIONS

PCT/US2021/031422, "International Search Report and Written Opinion", dated Aug. 10, 2021, 12 pages.

\* cited by examiner

GENERATING THREE DIMENSIONAL INFORMATION REGARDING STRUCTURAL ELEMENTS OF A SPECIMEN

BACKGROUND OF THE INVENTION

A specimen such as a semiconductor wafer is executed by a complex manufacturing process. Various specimens include multiple structural elements of nanometric dimensions that are formed at a certain side of the specimen and these structural elements should be evaluated during and after the manufacturing process.

The structural elements may extend from a surface of the substrate. The evaluation of the structural may be limited as the structural elements may be shaped as sized so that one or more structural elements conceal parts of one or more other structural elements.

Three dimensional information regarding such structural elements may be obtained using destructive methods such as transmissive electron microscopy (TEM) or scanning transmissive electron microscopy (STEM).

There is a growing need to provide a solution for acquiring three dimensional information regarding structural elements that is accurate and non-destructive.

BRIEF SUMMARY OF THE INVENTION

There may be provided a method, a non-transitory computer readable medium and a detection system for providing three dimensional information regarding structural elements of a specimen.

In some embodiments a method for providing three dimensional information regarding structural elements of a specimen is provided. The method can include: illuminating the structural elements with electron beams of different incidence angles, where the electron beams pass through the structural elements and the structural elements are of nanometric dimensions; detecting forward scattered electrons that are scattered from the structural elements to provide detected forward scattered electrons; and generating the three dimensional information regarding structural elements based at least on the detected forward scattered electrons.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

Any reference to the term "may be" should be applied mutatis mutandis to the term "may not be".

A "few" may be one, two, three, four, and the like.

The term tilt and deflection are used in an interchangeable manner.

Figure 1:
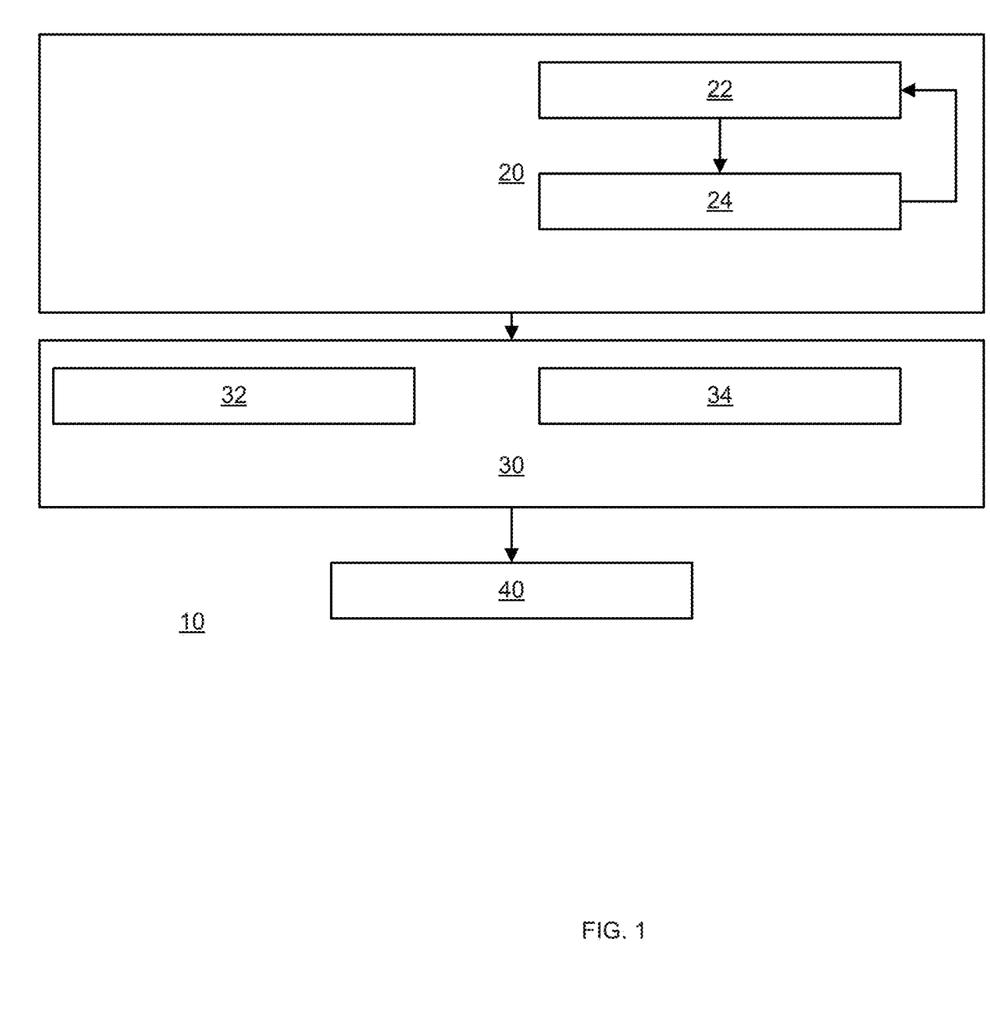
FIG. 1 illustrates an example of a method.

FIG. 1 is an example of method 10 for providing three dimensional information regarding structural elements of a specimen.

The structural elements may be of nanometric scale and thus have at least one dimension out of width, length and depth that is between one nanometer and one hundred nanometers. An upper part of the structural elements may be located at a nanometric distance from the surface of the specimen, either above the surface or below the surface.

The specimen may be a semiconductor wafer, a MEMS substrate, a solar panel, and the like.

Method 10 may start by step 20 of illuminating the structural elements with electron beams of different incidence angles, wherein the electron beams pass through the structural elements. The incident angle is the angle in which the electron beam impinges on the specimen.

The different incident angles may be oblique and may belong to an angular range that may be tens of degrees wide. For example, the different incident angles may belong to an angular range that spans between ninety degrees and thirty degrees in relation to the upper surface of the specimen. Other angular ranges may be provided. The number of incident angles within the angular range may be two, three, four, five or more than five.

The different incident angles may spread across the entire angular range. Incident angles may have different orders of symmetry related to any axis of surface symmetry, e.g. reflectional or rotational symmetry relative to normal or an axis directed at an angle other than normal to surface.

At least one out of the values of the incident angles, the number of incident angles, and the angular range may be determined based on the expected shapes and sizes of the structural elements. The obscurity of at least some of the parts of the structural elements may determine the manner of illumination. For example, more incident angles and/or a wider angular range may be required when the structural angles are denser and/or are taller.

The energy levels of the electron beams may be selected to allow the electron beams to penetrate through the structural elements at the different incident angles and to provide forward scattered electrons with up to a few interactions during the illumination and the scattering. For example, the energy of electron beam may be in the range typical for high voltage SEM, which is 10-30 keV, but may reach higher values, e.g. 50-70 keV.

For example—the penetration depth of the electron beams may exceed the height of the structural element by a factor of five, six, seven, eight, nine, ten, or even more than ten. The penetration depth is a function of the energy of the electron beam and of materials, of the structural elements and other parts of the specimen. For example, penetration depth of electron beam inside a silicon (Si) specimen is of order of magnitude of 3000 nanometers (nm), while typical size of a pattern of interest ranged between several tens of nm and single hundred nm.

Assuming that there are a first plurality (N1) of electron beams of different incidence angles, then step 20 may include illuminating the specimen in a sequential manner—one beam at a time, or illuminating the specimen with two till N1 electron beams at a time.

The illuminating may be performed by up to N1 columns, by one or more multi-beam columns, or any other electron optics that may generate one till N1 electron beams of different incident angles.

The differences between the incident angles of the electron beams may be obtained by mechanical tilt around horizontal axis and/or rotating around vertical axis and/or electro-magnetic deflection.

The mechanical tilt may include (a) only tilting the specimen, (b) only tilting electron optics associated with the electron beams, or (c) tilting the specimen and the electron optics.

Step 20 may be executed in iterations where each iteration includes illuminating (step 22) that is followed by tilting (step 24). The tilting changes the incident angle.

The high resolution of the method may be obtained by (a) the limited interaction of the electron beams and the forward scattered electrons with the substrate thereby preventing or reducing beam widening, and (b) using electron beams with diameter smaller than the structural elements—especially much smaller (for example less than 1/x where the variable x is two, three, four, five, six, seven, eight, ten and more) than the structural elements. Typical diameter of electron beam at pattern entrance is units of nm; at typical energies it remains within ten nm range along propagation in the pattern.

Using mechanical tilt (alone or in combination with the electrical deflection) provides a wider angular coverage of the structural elements in contrast to pure electron tilt that can be limited by aberrations to provide tilt at a narrow angular tilt of less than ten degrees.

Step 20 may be followed by step 30 of detecting forward scattered electron beams that are scattered from the structural elements to provide detected forward scattered electrons. The forward scattered electrons may also be scattered from the vicinity of the structural elements.

Step 30 may include at least one step out of spatial filtering (32) and energy filtering (34). The spatial filtering may be executed for reducing a detection of noise such as backscattered electrons scattered from the specimen.

The spatial filtering may include positioning at least one forward scattered electrons detector within one or more expected paths of the forward scattered electrons; for example by placing a forward scattered electron detector within angular range where emission of these electrons from the sample is expected. The at least one forward scattered electrons detector may have a field of view that is substantially limited to the one or more expected paths of the forward scattered electrons. For example—the field of view can barely exceed a region that is delimited by the one or more expected paths of the forward scattered electrons.

The energy filtering may be executed for reducing a detection of noise such as backscattered electrons scattered from the specimen.

The energy filtering may include passing (not blocking) electrons (forward scattered electrons) that have trajectory that represent electron paths that include up to a few scattering events and rejecting electrons (backscattered electrons) that have energy levels that represent electron paths that include more than the few scattering events.

Step 30 may be followed by step 40 of generating the three dimensional information regarding structural elements based at least on the detected forward scattered electrons. Any method for reconstructing a three dimensional information from images taken at different angles may be used.

The three dimensional information may provide full or partial information regarding the structural elements. For example, the three dimensional information may be a three dimensional model of the entire structural elements, of at least some obscured parts of the structural elements, and the like.

It should be noted that steps 20 and 30 may be executed one region of the specimen after the other. The entire specimen or only regions of interest of the specimen may be illuminated during step 20. Regions that differ from each other by one or more features of the structural element (for example density, shape, size, material) may be illuminated at different manners.

Figure 2:
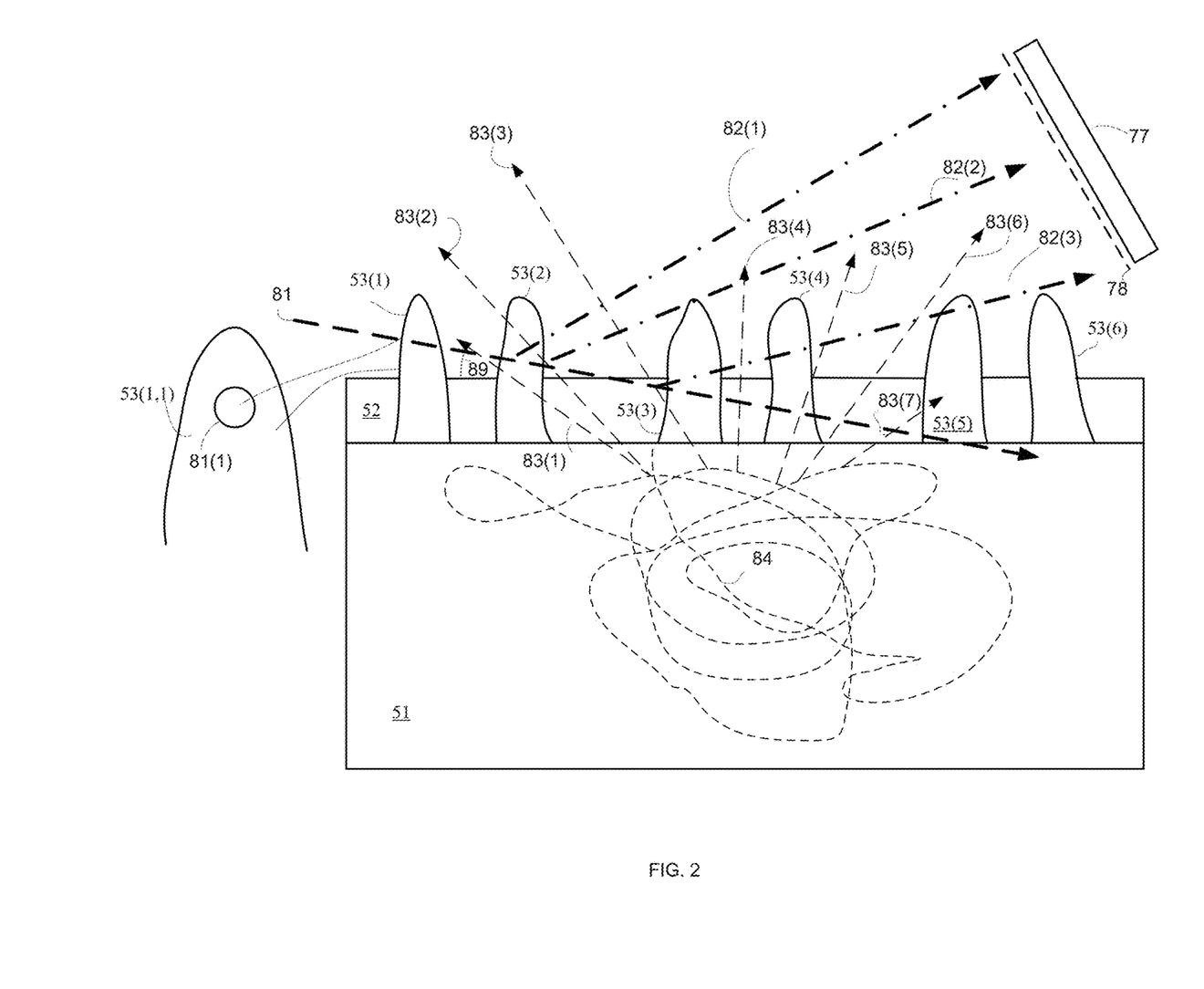
FIG. 2 illustrates an example of a cross section of a part of specimen, and various electron beams and trajectories.

FIG. 2 illustrates a cross section of a region of a specimen. The region includes bulk 51, upper layer 52, first structural element 53(1), second structural element 53(2), third structural element 53(3), fourth structural element 53(4), fifth structural element 53(5) and sixth structural element 53(6).

FIG. 2 also illustrates an electron beam 81 that illuminates the region at a certain incident angle 89 as passing through first structural element 53(1) and second structural element 53(2), and may proceed to penetrate the specimen (even to a depth that well exceeds the height of any of the structural element).

The electron beam 81 causes a first forward scattered electron to be emitted from the middle of second structural element 53(1) due to elastic scattering and follow a first path 82(1) toward energy filter 78 and forward scattered electrons detector 77.

The electron beam 81 causes a second forward scattered electron to be emitted from the periphery of second structural element 53(1) due to elastic scattering and follow a second path 82(2) toward energy filter 78 and forward scattered electrons detector 77.

The electron beam 81 causes a third forward scattered electron to be emitted from upper layer 52—for example—below the upper surface of the upper layer 52 due to elastic scattering and follow a third path 82(3) that passes through the third structural element 53(3) and the fourth structural element 53(4) and toward energy filter 78 and forward scattered electrons detector 77.

Backscattered electrons perform multiple scattering within a region 84 and are then emitted at different directions mostly outside the field of view of forward scattered electrons detector 77 as illustrated by first backscattered electron path 83(1), second backscattered electron path 83(2), third backscattered electron path 83(3), fourth backscattered electron path 83(4), fifth backscattered electron path 83(5), sixth backscattered electron path 83(6) and seventh backscattered electron path 83(7).

The spatial filtering illustrated in FIG. 2 is implemented by positioning the energy filter 78 and the forward scattered electrons detector 77 outside the first backscattered electron path 83(1), second backscattered electron path 83(2), third backscattered electron path 83(3), fourth backscattered electron path 83(4), fifth backscattered electron path 83(5), and seventh backscattered electron path 83(7).

The energy filtering illustrated in FIG. 2 is implemented by positioning the energy filter 78 in forward of the forward scattered electrons detector 77 so that the energy filter 78 may block the backscattered electron propagating along the sixth backscattered electron path 83(6).

FIG. 2 also illustrates that the spot 81(1) formed by electron beam 81 has an area that is much smaller than an area of the portion (sidewall 53(1,1)) of the first structural element 53(1) on which the electron beam impinges.

It should also be noted that the energy of the electron beam may be selected to penetrate through the upper layer 52 and even a part of the bulk 51.

FIGS. 3, 4, 5, 6 and 7 illustrate different examples of three-dimensional evaluation systems that apply at least one out of mechanical tilting and electrical deflection.

All three-dimensional evaluation systems include electron optics and a processing circuit.

The electron optics is configured to (a) illuminate structural elements of a specimen with electron beams of different incidence angles; wherein the electron beams pass through the structural elements; wherein the structural elements are of nanometric dimensions; and (b) detect forward scattered electron beams that are scattered from the structural elements. The electron optics may include at least some out of lenses, beam splitters, beam sources, and the like.

The processing circuit is configured to generate three dimensional information regarding structural elements.

It should be noted that the processing circuit may not belong to the three-dimensional evaluation system but may belong to a remote computer. Yet for another example, the three-dimensional evaluation system may perform a part of the generation of the three dimensional information regarding structural elements, while another processing circuit may perform another part of the processing.

In FIGS. 3, 4, 5, 6, 7 and 8, the three-dimensional evaluation system are illustrated as including electron optics, processing circuit 71, memory unit 72, and controller 73.

Controller 73 may be configured to control the operation of the three-dimensional evaluation system. The memory unit 72 may store instructions, commands, recipes, image information, and the like.

FIGS. 3, 4, 5, 6 and 7 illustrate electron beam 81 and a path 82 of a forward scattered electron. It should be noted that there may be multiple paths of forward scattered electrons.

Any one of the three-dimensional evaluation systems of FIGS. 3, 4, 5, 6, 7 and 8 may include energy filters that precede the forward scattered electrons detector 77. For simplicity of explanation these energy filters are not shown.

Figure 3:
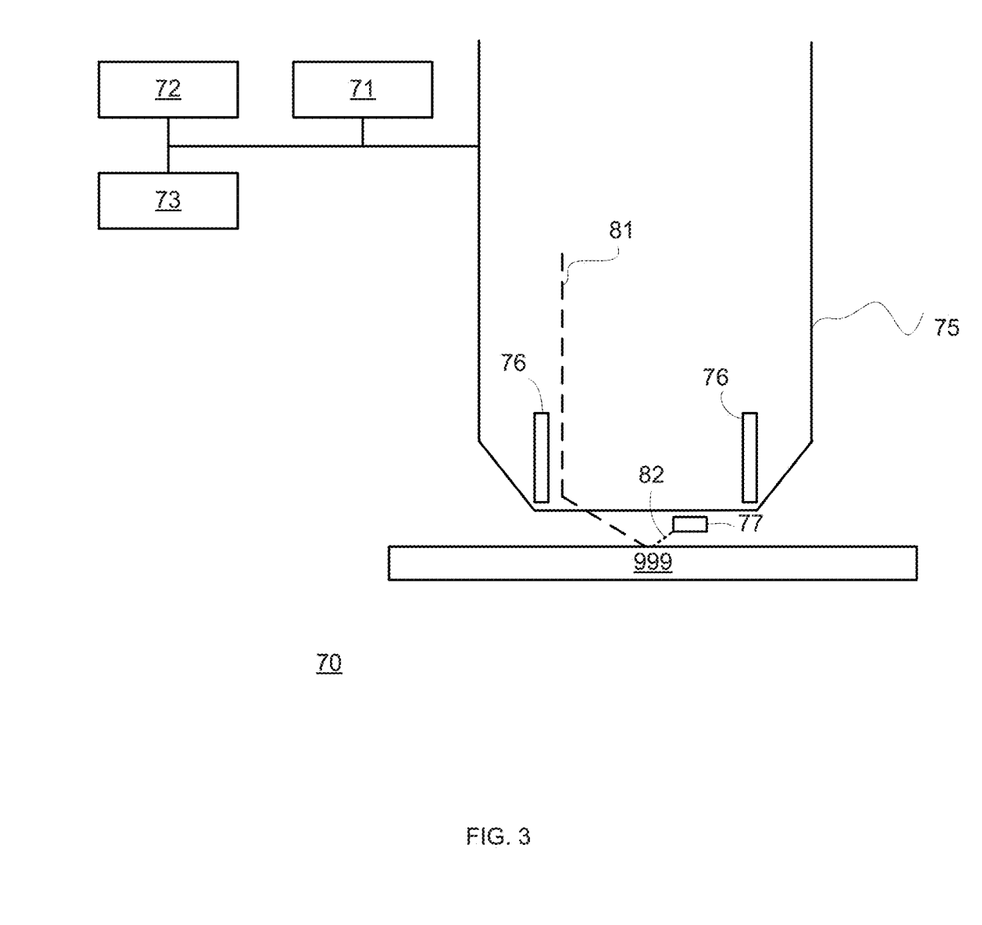
FIG. 3 illustrates an example of a specimen and a three-dimensional evaluation system.

FIG. 3 illustrates three-dimensional evaluation system 70 as including electron optics such as column 75 that may be a single-beam column that includes a beam source (now shown) for generating electron beam 81, deflectors 76 for deflecting the electron beam (perform beam deflection) to provide an electron beam of a first incident angle, and forward scattered electrons detector 77. There may be more than a single scattered electrons detector 77. The shape, size and/or position of the of the scattered electrons detector 77 may differ from those illustrated in FIG. 3.

In FIG. 3, a longitudinal axis of the column (optical axis) is perpendicular to the specimen 999.

Figure 4:
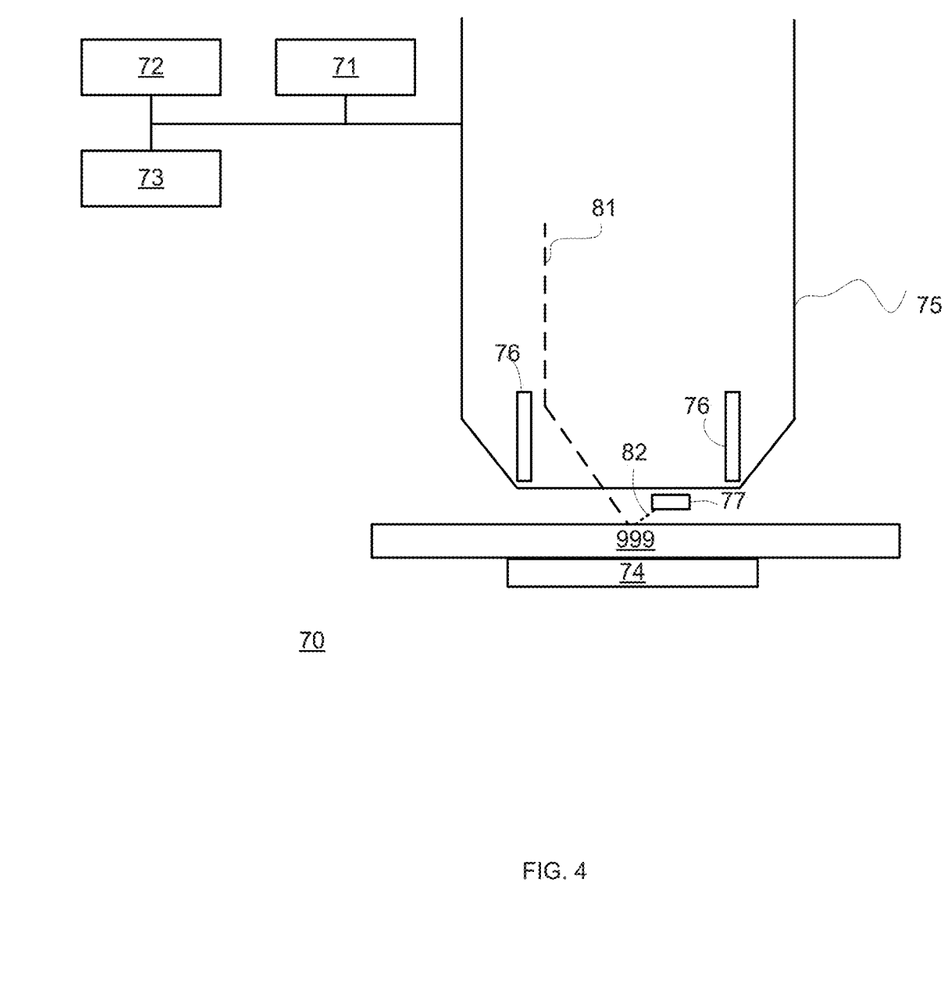
FIG. 4 illustrates an example of a specimen and a three-dimensional evaluation system.

FIG. 4 illustrates the same three-dimensional evaluation system 70—but the electron beam impinges (on the specimen) at a second incident angle that differs from the first incident angle.

Figure 5:
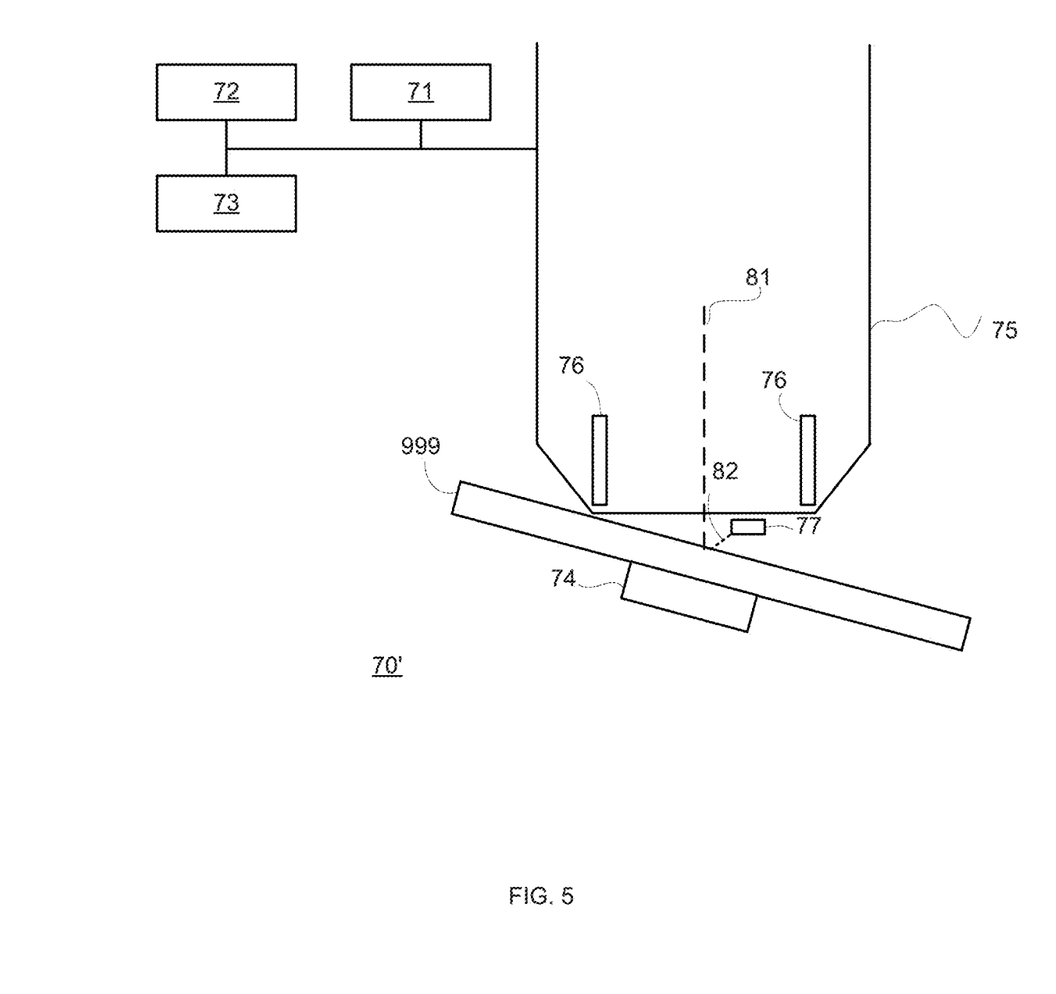
FIG. 5 illustrates an example of a specimen and a three-dimensional evaluation system.

FIG. 5 illustrates three-dimensional evaluation system 70' that includes a mechanical tilt unit 74 that tilts the specimen 999 in relation to the electron optics 75. FIG. 5 does not illustrate any electronic deflection of the electron beam 81.

Figure 6:
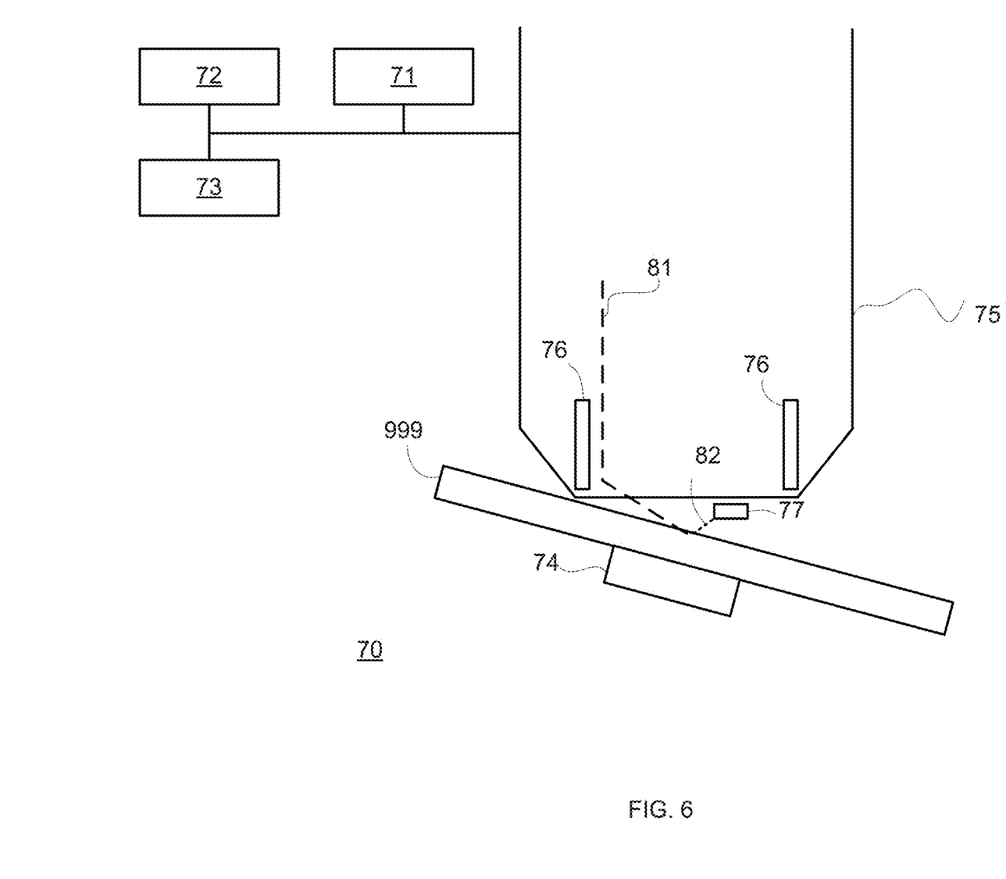
FIG. 6 illustrates an example of a specimen and a three-dimensional evaluation system.

FIG. 6 illustrates three-dimensional evaluation system 70' that includes the mechanical tilt unit 74 that tilts the specimen 999 in relation to the electron optics 75. FIG. 6 also illustrates an electronic deflection of the electron beam 81.

Figure 7:
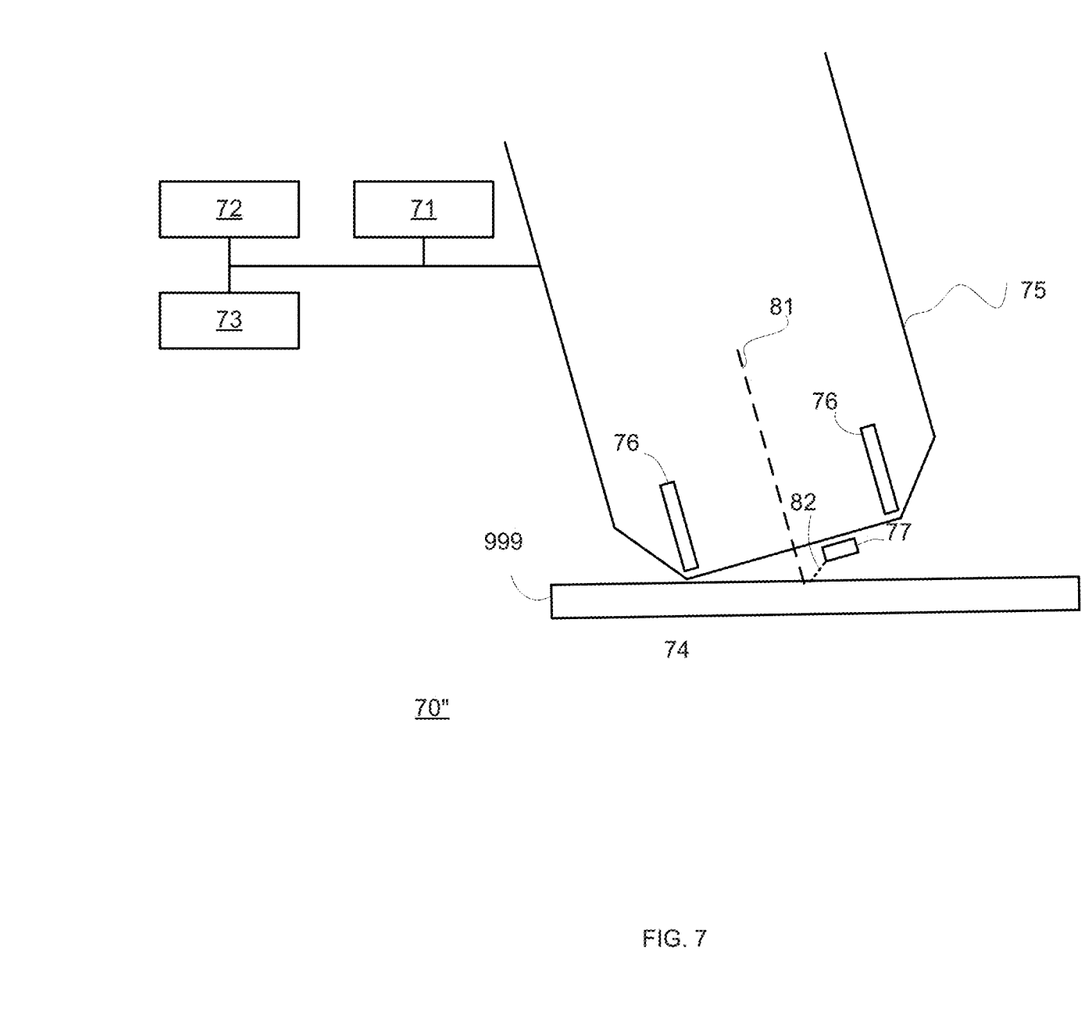
FIG. 7 illustrates an example of a specimen and a three-dimensional evaluation system.

FIG. 7 illustrates three-dimensional evaluation system 70" that includes another mechanical tilt unit (not shown) that tilts the electron optics 75 in relation to the specimen 999.

FIG. 7 does not illustrate any electronic deflection of the electron beam 81.

Figure 8:
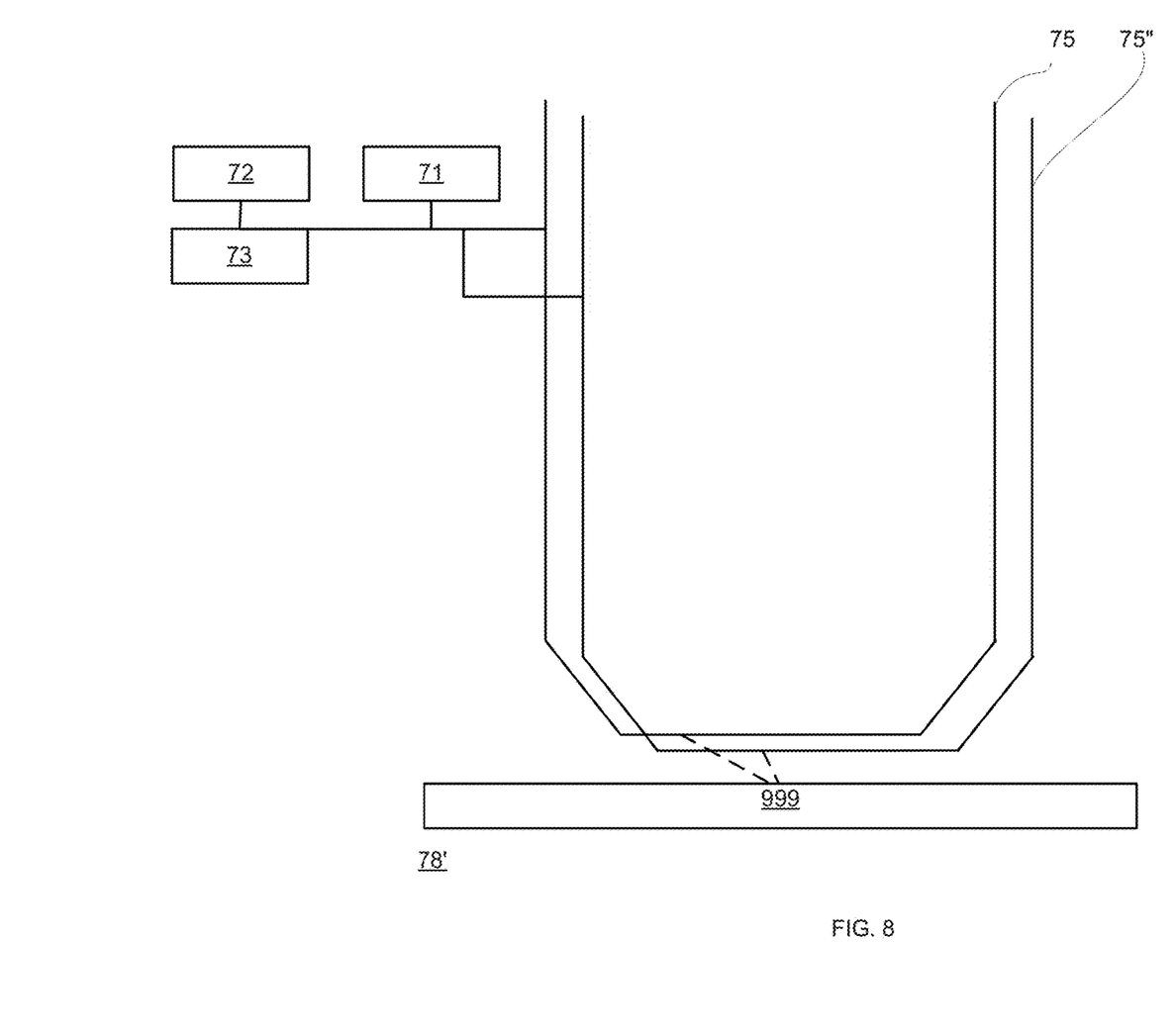
FIG. 8 illustrates an example of a specimen and a three-dimensional evaluation system that includes multi-column electron optics.

FIG. 8 illustrates three-dimensional evaluation system 77 that includes a multi-column electron optics as illustrated by column 75 and additional column 75". The two columns illuminate the specimen with two electron beams of different incident angles.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Any reference to the terms comprising or having should be applied mutatis mutandis to the terms consisting or "consisting essentially".

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A method for providing three dimensional information regarding a structural element of a specimen having nanometric dimensions, the method comprising:
   (a) illuminating the structural element with an electron beam generated by a column such that a central axis of the electron beam impinges the specimen at a first incident angle while detecting forward scattered electrons scattered from the structural element with a detector positioned above the specimen;
   (b) changing the incident angle at which the central axis of the electron beam impinges the specimen by mechanically tilting one or both of the specimen and electron optics of the ebeam column;
   (c) illuminating the structural element with an electron beam generated by the column at the changed incident angle while detecting forward scattered electrons scattered from the structural element with the detector;
   (d) repeating the steps (b) and (c) a plurality of times; and
   (e) generating the three dimensional information regarding the structural element based at least on the detected forward scattered electrons from each of the illuminating steps.

2. The method according to claim 1 wherein the detecting of the forward scattered electron beams comprises performing spatial filtering for reducing a detection of backscattered electrons scattered from the specimen.

3. The method according to claim 2 wherein the spatial filtering comprises positioning at least one forward scattered electrons detector within an expected path of the forward scattered electrons.

4. The method according to claim 1 wherein the detecting of the forward scattered electron beams comprises performing energy filtering for reducing a detection of backscattered electrons scattered from the specimen.

5. The method according to claim 4 wherein the spatial filtering comprises passing electrons that have energy levels that represent electron paths that include up to a few scattering events and rejecting electrons that have energy levels that represent electron paths that include more than the few scattering events.

6. The method according to claim 1 wherein the detecting comprises performing both spatial filtering and energy filtering for reducing a detection of backscattered electrons scattered from the specimen.

7. The method according to claim 1 wherein structural elements are located within a distance of few nanometers from an upper surface of the specimen.

8. The method according to claim 1 wherein a penetration depth of the electron beams exceeds a size of the structural element in the dimension normal to electron beam propagation direction by at least five times.

9. The method according to claim 1 wherein the illuminating of the structural elements comprises generating the electron beams of different incidence angles by different columns.

10. The method according to claim 1 wherein the illuminating comprises tilting and/or rotating at least one of the specimen and electron optics to generate the electron beams of different incidence angles.

11. The method according to claim 1 wherein an area of a spot formed on a portion of a structural element by an electron beam of each of the electron beams is smaller than an area of the portion of the structural element.

12. A three-dimensional evaluation system, comprising:
electron optics configured to (a) illuminate the structural element of a specimen with an electron beam generated by a column such that a central axis of the electron beam impinges the specimen at a first incident angle while detecting forward scattered electrons scattered from the structural element with a detector positioned above the specimen, where the electron beams pass through the structural elements and the structural elements are of nanometric dimensions; and (b) change the incident angle at which the central axis of the electron beam impinges the specimen by mechanically tilting one or both of the specimen and electron optics of the ebeam column; (c) illuminate the structural element with an electron beam generated by the column at the changed incident angle while detecting forward scattered electrons scattered from the structural element with the detector; and (d) repeat the steps (b) and (c) a plurality of times; and
a processing circuit configured to generate three dimensional information regarding the structural element based at least on the detected forward scattered electrons from each of the illuminating steps.

13. The three-dimensional evaluation system according to claim 12 wherein the three-dimensional evaluation system is configured to perform spatial filtering for reducing a detection of backscattered electrons scattered from the specimen.

14. The three-dimensional evaluation system according to claim 12 wherein the three-dimensional evaluation system is configured to perform energy filtering for reducing a detection of backscattered electrons scattered from the specimen.

15. The three-dimensional evaluation system according to claim 12 wherein the three-dimensional evaluation system is configured to perform both spatial filtering and energy filtering for reducing a detection of backscattered electrons scattered from the specimen.

16. The three-dimensional evaluation system according to claim 12 wherein a penetration depth of the electron beams exceeds a height of the structural element by at least five times.

17. The three-dimensional evaluation system according to claim 12 wherein the electron optics comprises different columns.

18. The three-dimensional evaluation system according to claim 12 wherein the three-dimensional evaluation system comprises at least one tilting units for tilting at least one of the specimen and electron optics to generate the electron beams of different incidence angles.

19. The three-dimensional evaluation system according to claim 12 wherein the electron optics are configured to generate electron beams that exhibit an area of a spot formed on a portion of a structural element by an electron beam of each of the electron beams is smaller than an area of the portion of the structural element.

20. A non-transitory computer readable medium for providing three dimensional information regarding structural elements of a specimen, the non-transitory computer readable medium stores instructions for:
(a) illuminating the structural element with an electron beam generated by a column such that a central axis of the electron beam impinges the specimen at a first incident angle while detecting forward scattered electrons scattered from the structural element with a detector positioned above the specimen;
(b) changing the incident angle at which the central axis of the electron beam impinges the specimen by mechanically tilting one or both of the specimen and electron optics of the ebeam column;
(c) illuminating the structural element with an electron beam generated by the column at the changed incident angle while detecting forward scattered electrons scattered from the structural element with the detector;
(d) repeating the steps (b) and (c) a plurality of times; and
generating the three dimensional information regarding structural element based at least on the detected forward scattered electrons from each of the illuminating steps.

* * * * *